United States Patent
Takahashi et al.

(10) Patent No.: US 11,920,227 B2
(45) Date of Patent: Mar. 5, 2024

(54) PD ALLOY, PD ALLOY MATERIAL AND PROBE PIN FOR ELECTRIC AND ELECTRONIC DEVICES, AND METHODS FOR MANUFACTURING THE SAME

(71) Applicant: TOKURIKI HONTEN CO., LTD., Tokyo (JP)

(72) Inventors: Makoto Takahashi, Ibaraki (JP); Kazuya Soumiya, Saitama (JP); Ryu Shishino, Fukuoka (JP)

(73) Assignee: TOKURIKI HONTEN CO., LTD., Tokyo (JP)

( * ) Notice: Subject to any disclaimer, the term of this patent is extended or adjusted under 35 U.S.C. 154(b) by 0 days.

(21) Appl. No.: 17/291,023

(22) PCT Filed: May 9, 2019

(86) PCT No.: PCT/JP2019/018587
§ 371 (c)(1),
(2) Date: May 4, 2021

(87) PCT Pub. No.: WO2019/194322
PCT Pub. Date: Oct. 10, 2019

(65) Prior Publication Data
US 2021/0310103 A1    Oct. 7, 2021

(30) Foreign Application Priority Data

Nov. 6, 2018 (JP) ................... 2018-208822

(51) Int. Cl.
*C22C 5/04* (2006.01)
*G01R 1/073* (2006.01)

(52) U.S. Cl.
CPC ............ *C22C 5/04* (2013.01); *G01R 1/07342* (2013.01)

(58) Field of Classification Search
CPC .. C22C 5/04; C22C 30/02; C22C 5/06; C22C 30/04; C22C 30/06; C22C 5/08; C22C 9/00; C22C 9/04; C22C 9/06; G01R 1/06755; G01R 1/06716; G01R 1/06722; G01R 1/06738; G01R 1/06761; G01R 1/07314; G01R 1/07357; G01R 3/00
See application file for complete search history.

(56) References Cited

U.S. PATENT DOCUMENTS

2014/0377129 A1* 12/2014 Shishino ................. C22C 30/02
                                                                                420/587
2017/0218481 A1*  8/2017 Klein ................. G01R 1/06755

FOREIGN PATENT DOCUMENTS

| CN | 104024448 | 9/2014 |
| CN | 108699629 | 10/2018 |
| JP | 4878401 | 2/2012 |
| JP | 2012-242184 | 12/2012 |
| JP | 2014-114465 | 6/2014 |
| JP | 2014114465 A * | 6/2014 |
| JP | 2017-025354 | 2/2017 |
| WO | 2013/099682 | 7/2013 |
| WO | 2017/132504 | 8/2017 |

OTHER PUBLICATIONS

International Search Report issued in PCT/JP2019/018587, dated Aug. 6, 2019, along with an English language translation.
Notice of Reasons for Refusal issued in JP Patent Application No. 2019-556286 dated Mar. 17, 2020, along with an English language translation.
Office Action issued in CN Patent Application No. 201980060676.0, dated Jun. 23, 2021, English translation.
Office Action issued in KR Patent Application No. 10-2021-7013195, dated Jul. 28, 2021, English translation.
Office Action issued in CN Patent Application No. 201980060676.0, dated Nov. 22, 2021, English translation.
Office Action received in Chinese Patent Application No. 201980060676.0, dated Feb. 16, 2022, translation.

* cited by examiner

*Primary Examiner* — Lee E Rodak
(74) *Attorney, Agent, or Firm* — GREENBLUM & BERNSTEIN, P.L.C.

(57) ABSTRACT

An object of the present invention is to provide a Pd alloy, a Pd alloy material, and a probe pin for electric and electronic devices in which specific resistance, hardness, and processability are balanced at a higher level than before, and methods for manufacturing the same. In order to achieve this object, the Pd alloy for electric and electronic devices according to the present invention having a composition comprising 50.1 mass % or more and 55.5 mass % or less of Pd, 6.3 mass % or more and 16.1 mass % or less of Ag, 30.0 mass % or more and 38.0 mass % or less of Cu, and 0.5 mass % or more and 2.0 mass % or less of In is adopted.

8 Claims, No Drawings

PD ALLOY, PD ALLOY MATERIAL AND PROBE PIN FOR ELECTRIC AND ELECTRONIC DEVICES, AND METHODS FOR MANUFACTURING THE SAME

TECHNICAL FIELD

The present invention relates to Pd alloys used in electric and electronic devices mainly represented by probe pins for inspection such as semiconductor integrated circuits.

BACKGROUND ART

Conventionally, a probe card in which a plurality of probe pins are arranged has been used when inspecting the electrical characteristics of electric devices such as semiconductor integrated circuits. Usually, the tip of the probe pin mounted on the probe card is brought into contact with the inspection target part of the electric device to inspect the electrical characteristics. Therefore, the probe pin is required to have a low specific resistance and be a good conductive material. In addition, since the probe pin is used by repeatedly contacting it thousands of times and tens of thousands of times, it is required to be sufficiently hard so that they do not wear out. However, if the probe pin becomes too hard, the inspection target will be damaged if the inspection target is a gold-plated electrode, copper wiring, or the like. Therefore, the probe pin is required to be less likely to damage the inspection target while suppressing wear. In addition to these, the probe pin may be processed into various shapes and used, and is also required to have excellent processability.

Generally, Ag—Pd—Cu alloys are widely used as a material for probe pins. For example, Patent Literature 1 discloses an alloy material for a probe pin containing 33 to 42 mass % of Pd, 18 to 32 mass % of Cu, 0.5 to 2 mass % of In, and 0.05 to 2 mass % of Re, with the balance being Ag and unavoidable impurities, and is subjected to swaging processing to make the crystal finer, and further subjected to solution treatment, plastic processing and precipitation hardening treatment to have a hardness of 400 HV or more, for the purpose of providing an alloy material for probe pins, which is excellent in plastic processability and has a sufficient effect of improving hardness by precipitation hardening.

Patent Literature 2, for the purpose of providing a probe pin that can be used stably for a long period of time, discloses a probe pin made of a material having 50.2 to 85 mass % Ag-based alloy with 0.2 to 3.0 mass % of In or/and Sn, 8 to 35 mass % of Pd, and 6 to 40 mass % of Cu, in a total of 100 mass % in combination with unavoidable impurities, and having a Vickers hardness of 200 to 400, a difference in Vickers hardness between before and after aging treatment of 10 or more, and a specific resistance of 15 $\mu\Omega\cdot$cm or less by performing aging treatment at 250 to 500° C. after rolling or/and wire processing with a rolling rate or cross-sectional reduction rate of 40% or more.

CITATION LIST

Patent Literature

Patent Literature 1: Japanese Patent Laid-Open No. 2017-25354

Patent Literature 2: Japanese Patent Laid-Open No. 2014-114465

SUMMARY OF INVENTION

Technical Problem

However, with the recent miniaturization and enhancement of performance of electric devices such as semiconductor integrated circuits, the pitches are becoming narrower and the number of pins is increasing in the inspection target parts of the semiconductor integrated circuits to be inspected. Thus, the probe pins that come into contact with the inspection target parts are required to have a narrower pitch and a finer wire diameter than ever before. In response to this trend, even if the materials disclosed in Patent Literatures 1 and 2 are used, it is difficult to sufficiently meet all the requirements of specific resistance, hardness, and processability as a probe pin material. Therefore, conventionally, there has been a demand for a material that meets all of these requirements and provide sufficiently excellent reliability and durability of the inspection when used as a probe pin.

The present invention has been made in the context of the above circumstances, and a challenge of the present invention is to provide a Pd alloy, a Pd alloy material and a probe pin for electric and electronic devices in which specific resistance, hardness, and processability are balanced at a higher level than before, and methods for manufacturing the same.

Solution to Problem

Therefore, as a result of intensive research, the present inventors have come to provide the following Pd alloy, Pd alloy material and probe pin for electric and electronic devices, and methods for manufacturing the same.

Pd Alloy for Electric and Electronic Devices According to the Present Invention:

The Pd alloy for electric and electronic devices according to the present invention is characterized by containing Pd as a main component and having the following composition.

[Pd Alloy Composition]

Pd: 50.1 mass % or more and 55.5 mass % or less

Ag: 6.3 mass % or more and 16.1 mass % or less

Cu: 30.0 mass % or more and 38.0 mass % or less

In: 0.5 mass % or more and 2.0 mass % or less

Pd alloy material for electric and electronic devices according to the present invention: The Pd alloy material for electric and electronic devices according to the present invention is characterized in that it is obtained by shape-processing the above-mentioned Pd alloy for electric and electronic devices into a plate or wire shape by plastic processing with which the cross-sectional reduction rate becomes 50% or more and 95% or less.

Probe pin according to the present invention: The probe pin according to the present invention is characterized in that it is obtained by using the above-mentioned Pd alloy material for electric and electronic devices.

In the probe pin according to the present invention, the Vickers after heat treatment at a temperature of 350° C. or more and 550° C. or less is preferably 300 HV or more and 480 HV or less.

The probe pin according to the present invention preferably has a specific resistance of 6.0 $\mu\Omega\cdot$cm or more and 8.0 $\mu\Omega\cdot$cm or less.

Method for Manufacturing Pd Alloy Material for Electric and Electronic Devices According to the Present Invention:

The method for manufacturing a Pd alloy material for electric and electronic devices according to the present invention comprises processing a Pd alloy for electric and electronic devices having the above-mentioned Pd alloy composition into a plate or wire shape so that the cross-sectional reduction rate is 50% or more and 95% or less in the final plastic processing during plastic processing.

Method for Manufacturing Probe Pin According to the Present Invention:

The method for manufacturing a probe pin according to the present invention comprises providing a probe pin shape using a Pd alloy material for electric and electronic devices that has been processed into a wire shape so that the cross-sectional reduction rate is 50% or more and 95% or less in the final plastic processing during plastic processing a Pd alloy for electric and electronic devices having the above-mentioned Pd alloy composition; and heat-treating the probe pin shape at a temperature of 350° C. or more and 550° C. or less to adjust the Vickers hardness to 300 HV or more and 480 HV or less.

Advantageous Effects of Invention

The Pd alloy for electric and electronic devices according to the present invention has good processability, and crystal grains can be easily refined and toughened by plastic processing. Therefore, when the Pd alloy for electric and electronic devices is subjected to a certain amount of high deformation and plastic deformation to make a plate material, a wire material, or the like, a Pd alloy material for electric and electronic devices having good strength is obtained. In particular, this Pd alloy material for electric and electronic devices has sufficient hardness to be used as a probe pin. In addition, the Pd alloy material for electric and electronic devices can suppress the specific resistance to a low value as an inherent property of the Pd alloy for electric and electronic devices according to the present invention. Therefore, when used as a probe pin, the heat load on the inspection target can be reduced. Therefore, even when the probe pin using the Pd alloy material for electric and electronic devices according to the present invention is miniaturized, the reliability of the inspection can be improved and the life of the probe pin itself can be extended.

DESCRIPTION OF EMBODIMENTS

Hereinafter, the best mode for carrying out the present invention will be described.

<Mode of Pd Alloy for Electric and Electronic Devices According to the Present Invention>

The Pd alloy for electric and electronic devices according to the present invention is characterized by having the following composition.

[Pd Alloy Composition]
  Pd: 50.1 mass % or more and 55.5 mass % or less
  Ag: 6.3 mass % or more and 16.1 mass % or less
  Cu: 30.0 mass % or more and 38.0 mass % or less
  In: 0.5 mass % or more and 2.0 mass % or less Specifically, the present invention is a Pd alloy for electric and electronic devices suitable for a probe pin for inspection of electric devices such as semiconductor integrated circuits, which has high hardness, low specific resistance, and excellent processability by controlling the amount of these alloy components in the Pd alloy. Hereinafter, each element of these alloy components included in the Pd alloy according to the present invention will be described separately.

The Pd alloy for electric and electronic devices according to the present invention is a Pd-based alloy. Therefore, Pd is an essential component and has an action of lowering the specific resistance even if the hardness of the alloy increases. The content of Pd in the Pd alloy for electric and electronic devices according to the present invention is preferably 50.1 mass % (40.0 atom %) or more and 55.5 mass % (45.0 atom %) or less. If the content of Pd is less than 50.1 mass % (40.0 atom %), the specific resistance increases and the reliability of the inspection when used for the probe pin is lowered, which is not preferable. On the other hand, when the content of Pd exceeds 55.5 mass % (45.0 atom %), the specific resistance is lowered, but the hardness is also lowered. Therefore, when used as a probe pin application, it is not preferable because the wear at the point of use becomes severe.

Ag as an alloying element has an action of improving the corrosion resistance and lowering the specific resistance as the hardness of the alloy increases. The content of Ag as an alloying element is preferably 6.3 mass % (5.0 atom %) or more and 16.1 mass % (13.0 atom %) or less. If the content of Ag as an alloying element is less than 6.3 mass % (5.0 atom %), the corrosion resistance is lowered and the hardness is lowered, which is not preferable. In this case, even if the amount of the added element is adjusted, the Vickers hardness of the obtained Pd alloy will be less than 300 HV even if it is processed to a final cross-sectional reduction rate of about 50%. Therefore, there is a problem that the hardness is insufficient for the probe pin application and the wear resistance is reduced. On the other hand, when the content of Ag as an alloying element exceeds 16.1 mass % (13.0 atom %), the specific resistance is rather increased, which is not preferable. When the content of Ag as an alloying element is 16.1 mass % (13.0 atom %) or less, it is possible to suppress the specific resistance of the Pd alloy to 8.0 μΩ·cm or less, which is preferable.

Cu as an alloying element is a component necessary for precipitation hardening, and has an action of increasing the hardness of the alloy and decreasing the specific resistance. The content of Cu as an alloying element is preferably 30.0 mass % (45.0 atom %) or more and 38.0 mass % (50.0 atom %) or less. If the content of Cu as an alloying element is less than 30.0 mass % (45.0 atom %), the specific resistance increases and the reliability of the inspection is reduced for the probe pin application, which is not preferable. On the other hand, when the content of Cu as an alloying element exceeds 38.0 mass % (50.0 atom %), the specific resistance decreases, but the hardness also decreases. Thus, when used as a probe pin application, it is not preferable because the wear at the point of use becomes severe and it becomes easy to oxidize, which causes a decrease in corrosion resistance.

In as an alloying element has the effect of being solid-solved in the matrix of Pd to improve the hardness after plastic processing and improve the wear resistance of the alloy. The content of In as an alloying element is preferably 0.5 mass % (0.35 atom %) or more and 2.0 mass % (1.55 atom %) or less. If the content of In as an alloying element is less than 0.5 mass % (0.35 atom %), the hardness is reduced, which is not preferable. In this case, even if the amount of the element to be added is adjusted, it is difficult to obtain a Vickers hardness of 300 HV or more even if the obtained Pd alloy is processed to a final cross-sectional reduction rate of about 50%. On the other hand, when the content of In as an alloying element exceeds 2.0 mass % (1.55 atom %), the hardness and the specific resistance increase and the processability decreases, and cracks may occur in the process of performing the desired processing, which is not preferable.

As a method for preparing the Pd alloy for electric and electronic devices described above, it is preferable to adopt a melting method. This melting method is not particularly limited as long as it can produce a state of an alloy ingot. Therefore, any melting methods which is or will be established, such as a vacuum melting method, a gas melting method, an electric furnace melting method, a high frequency melting method, a continuous casting method, and a zone melting method, can be adopted.

The Pd alloy for electric and electronic devices according to the present invention may contain at least one selected from the group of Ir, Rh, Co, Ni, Zn, Sn, Au, and Pt as additive elements and unavoidable impurities in total of 0.1 mass % or more and 2.0 mass % or less. Here, the unavoidable impurities refer to impurity elements that are unavoidably mixed in during the manufacturing process, and refer to those of 0.01 mass % or less.

<Mode of Pd Alloy Material for Electric and Electronic Devices According to the Present Invention and Method for Manufacturing the Same>

The Pd alloy for electric and electronic devices according to the present invention having the composition described above is preferably melted to a predetermined composition and then subjected to plastic processing to obtain a plate-shaped or wire-shaped Pd alloy material for electric and electronic devices. By using such a shape, the strength can be adjusted according to the type of electric and electronic devices for use. Therefore, as a processed material, the Pd alloy material can be made excellent in total balance of specific resistance, hardness, and processability, which makes it suitable for use in electric and electronic devices.

A method for manufacturing a Pd alloy material for electric and electronic devices will be described. This manufacturing method comprises processing a Pd alloy for electric and electronic devices having the above composition into a plate or wire shape so that the cross-sectional reduction rate becomes 50% or more and 95% or less in the final plastic processing during plastic processing. At this time, the cross-sectional reduction rate is the cross-sectional reduction rate at the final stage of processing when there are a plurality of plastic processing steps. The larger the cross-sectional reduction rate, the higher the hardness can be. However, by improving the hardness within the range where plastic processing is possible, it is possible to obtain a Pd alloy material for electric and electronic devices having an excellent total balance of low specific resistance, hardness, and processability. If the cross-sectional reduction rate due to this plastic processing is less than 50%, it is not preferable because sufficient hardening by processing and crystal grain refinement effects cannot be obtained. On the other hand, if high deformation with a cross-sectional reduction rate of more than 95% due to plastic processing is performed, there is a high probability that cracks will occur due to processing strain even if sufficient strain removal is performed prior to processing, which is not preferable because it causes a decrease in yield. The method of plastic processing the Pd alloy for electric and electronic devices into a plate or wire shape is not particularly limited, and rolling processing, wire drawing processing, forging processing and the like can be adopted.

<Mode of Probe Pin According to the Present Invention and Method for Manufacturing the Same>

The probe pin according to the present invention is obtained by using the above-mentioned Pd alloy material for electric and electronic devices. That is, it is characterized by the use of a Pd alloy material for electric and electronic devices obtained by subjecting the Pd alloy for electric and electronic devices to plastic processing so that the cross-sectional reduction rate is 50% or more and 95% or less. By using this Pd alloy material for electric and electronic devices in the production of the probe pin according to the present invention, it is possible to obtain a probe pin having low specific resistance and good hardness.

The probe pin according to the present invention preferably has a Vickers hardness of 300 HV or more and 480 HV or less. The method for manufacturing such a probe pin comprises providing a probe pin shape using a Pd alloy material for electric and electronic devices obtained by plastic processing the Pd alloy for electric and electronic devices as described above, and then heat-treating the probe pin shape at a temperature of 350° C. or more and 550° C. or less to adjust the Vickers hardness to 300 HV or more and 480 HV or less.

Here, "Vickers hardness to 300 HV or more and 480 HV or less" is because it is the hardness required for probe pins in the market. If the probe pin has a hardness within this range, the change in resistance value due to wear is reduced, and it becomes possible to improve the inspection accuracy and the inspection yield. The heat treatment at a temperature of 350° C. or more and 550° C. or less is for improving the hardness by precipitation strengthening. Here, regarding the precipitation heat treatment temperature, if it is less than 350° C., the hardness cannot be sufficiently improved, and if it exceeds 550° C., the probe pin tends to soften. The precipitation heat treatment time can be appropriately set to a time during which precipitation hardening occurs sufficiently on the material.

By adopting the above-mentioned Pd alloy for electric and electronic devices, the probe pin according to the present invention can exhibit a performance of a specific resistance of 6.0 $\mu\Omega\cdot cm$ or more and 8.0 $\mu\Omega\cdot cm$ or less. When the specific resistance is 6.0 $\mu\Omega\cdot cm$ or more and 8.0 $\mu\Omega\cdot cm$ or less, it can be suitably used as a material for probe pins used for inspection of electric devices such as semiconductor integrated circuits.

Next, the Pd alloy for electric and electronic devices according to the present invention will be described with reference to Examples and Comparative Examples. In Examples and Comparative Examples shown below, alloys having various compositions were produced, processed into wire shapes or plate shapes, and their hardness and specific resistance were measured after plastic processing and after the precipitation heat treatment. The processability was also checked.

Example 1

Preparation of a Pd Alloy for Electric and Electronic Devices:

In Example 1, an ingot (φ20 mm) of Ag—Pd—Cu—In based alloy composed of four elements of Ag, Pd, Cu and In was prepared by vacuum melting.

Preparation of Pd Alloy Materials for Electric and Electronic Devices:

Melting defects such as molten metal shrinkage were removed from the ingot and solution treatment (800° C.) was performed, and then plastic processing (swaging processing, groove rolling processing, and wire drawing processing) and solution treatment (800° C.) were repeated to obtain a Pd alloy wire material having a final cross-sectional reduction rate (the cross-sectional reduction rate at the end of the subsequent wire drawing process based on the rate immediately after the final solution treatment) of 50% or more and 95% or less. Table 1 shows the compositions of the samples of Example 1 (Examples 1-1 to 1-4).

In Example 1, the Vickers hardness of the obtained Pd alloy wire material was measured after precipitation hardening. The conditions for precipitation hardening were 350° C. or more and 550° C. or less in a $H_2+N_2$ mixed atmosphere. For the Vickers hardness measurement, the Pd alloy wire material was cut to a length of 10 mm and used as a sample. Then, after polishing and smoothing the cross section of this sample, it was measured at HV0.2 using a Vickers hardness tester. The measurement results are shown in Table 1. Table 1 shows the average value of the results of measuring the Vickers hardness at five points for each sample.

In Example 1, the specific resistance of the obtained Pd alloy wire material was measured after precipitation hardening. The conditions for precipitation hardening were 350° C. or more and 550° C. or less in a $H_2+N_2$ mixed atmosphere. For the specific resistance measurement, the Pd alloy wire material was cut to a length of 1000 mm and used as a sample. Then, the specific resistance of this sample was measured by the 4-terminal method using a resistance meter (RM3544 manufactured by Hioki Electric Co., Ltd.). Table 1 shows the average value of the results of measuring the specific resistance at three points for each sample.

Furthermore, in Example 1, the processability of the obtained Pd alloy wire material was confirmed. To confirm the processability, the Pd alloy wire material was cut to a length of 1000 mm and used as a sample. This sample was then checked for cracks when subjected to plastic processing at 50% or more and 95% or less. In Table 1, the case where cracks cannot be confirmed is shown as a pass "○", and the case where cracks can be confirmed is shown as a fail "X".

Example 2

Preparation of Pd Alloys for Electric and Electronic Devices:

In Example 2, an ingot (thickness 10 mm×length 50 mm×width 20 mm) of Ag—Pd—Cu—In based alloy composed of four elements of Ag, Pd, Cu, and In was prepared by vacuum melting.

Preparation of Pd Alloy Materials for Electric and Electronic Devices:

Melting defects such as molten metal shrinkage were removed from the ingot, solution treatment (800° C.) was performed, and then the ingot was rolled until the cross-sectional reduction rate was 50% or more and 95% or less to obtain a Pd alloy plate material. Table 2 shows the compositions of the samples of Example 2 (Examples 2-1 to 2-4).

In Example 2, the Vickers hardness measurement, the specific resistance measurement, and the processability confirmation of the obtained Pd alloy plate material were carried out in the same manner as in Example 1. Since the conditions for carrying out these are the same as those in Example 1, the description thereof is omitted here. Table 2 shows the measurement results of the samples of Example 2 (Examples 2-1 to 2-4).

Comparative Example

Comparative Example 1

Comparative Example 1 is shown for comparison with the above-mentioned Example 1. In Comparative Example 1, the same confirmation as in Example 1 was carried out for a Pd alloy having a composition not satisfying the conditions specified in the present invention. Since the conditions for confirming Comparative Example 1 are also the same as those in Example 1, the description thereof will be omitted here. Table 1 shows the measurement results of the samples of Comparative Example 1 (Comparative Examples 1-1 to 1-4) together with those of Example (in Table 1, the parts that do not satisfy the composition conditions specified in the present invention are surrounded by bold lines).

Comparative Example 2

Comparative Example 2 is shown for comparison with the above-mentioned Example 2. In Comparative Example 2, the same confirmation as in Example 2 was carried out for a Pd alloy having a composition not satisfying the conditions specified in the present invention. Since the conditions for confirming Comparative Example 2 are also the same as those in Example 2, the description thereof will be omitted here. Table 2 shows the measurement results of the samples of Comparative Example 2 (Comparative Examples 2-1 to 2-4) together with those of Example (in Table 2, the parts that do not satisfy the composition conditions specified in the present invention are surrounded by bold lines).

[Comparison Between Example 1 and Comparative Example 1]

Hereinafter, the comparison between Example 1 and Comparative Example 1 will be performed with reference to Table 1.

TABLE 1

| Sample | Composition (mass%) | | | | Vickers hardness (HV0.2) | | Specific resistance (μΩ · cm) | | Processability |
| --- | --- | --- | --- | --- | --- | --- | --- | --- | --- |
| | Ag | Pd | Cu | In | After plastic processing | After precipitation heat treatment | After plastic processing | After precipitation heat treatment | |
| Example 1-1 | 10.2 | 53.4 | 35.5 | 1.0 | 320 | 441 | 29.5 | 7.3 | ○ |
| Example 1-2 | 12.5 | 52.0 | 34.8 | 0.8 | 317 | 480 | 27.8 | 7.6 | ○ |
| Example 1-3 | 12.5 | 51.7 | 34.6 | 1.3 | 318 | 460 | 28.2 | 7.4 | ○ |
| Example 1-4 | 12.5 | 51.6 | 34.5 | 1.5 | 319 | 475 | 27.9 | 7.5 | ○ |
| Comparative Example 1-1 | 6.3 | 55.6 | 37.1 | 1.0 | 293 | 292 | 30.4 | 5.9 | ○ |

TABLE 1-continued

| | Composition (mass%) | | | | Vickers hardness (HV0.2) | | Specific resistance (μΩ · cm) | | |
|---|---|---|---|---|---|---|---|---|---|
| Sample | Ag | Pd | Cu | In | After plastic processing | After precipitation heat treatment | After plastic processing | After precipitation heat treatment | Processability |
| Comparative Example 1-2 | 10.3 | 53.9 | 35.8 | — | 285 | 373 | 29.3 | 9.6 | ○ |
| Comparative Example 1-3 | 12.4 | 50.7 | 33.9 | 3.0 | 351 | 563 | 22.4 | 10.5 | × |
| Comparative Example 1-4 | 16.1 | 49.7 | 33.2 | 1.0 | 321 | 518 | 27.8 | 8.6 | ○ |

From the results shown in Table 1, in terms of Vickers hardness, all the samples of Examples 1-1 to 1-4 had Vickers hardness of 300 HV or more after plastic processing, and achieved values exceeding 400 HV by the precipitation heat treatment, and these values satisfied the condition required as a probe pin (300 HV or more and 480 HV or less). In terms of specific resistance, all the samples of Examples 1-1 to 1-4 achieved values of 8.0 μΩ·cm or less by the precipitation heat treatment, and these values satisfied the conditions required for probe pins (6.0 μΩ·cm or more and 8.0 μΩ·cm or less). In terms of processability, it was not possible to confirm cracks in the samples of Examples 1-1 to 1-4.

From the results shown in Table 1, in terms of Vickers hardness, the samples of Comparative Examples 1-1 and 1-2 had a Vickers hardness of less than 300 HV after plastic processing, and Comparative Example 1-1 also had values of below 300 HV after the precipitation heat treatment. The samples of Comparative Examples 1-3 and 1-4 had a Vickers hardness of more than 500 HV by the precipitation heat treatment. In terms of specific resistance, the samples of Comparative Example 1-1 had values of lower than 6.0 μΩ·cm by the precipitation heat treatment, and the samples of Comparative Examples 1-2 to 1-4 had values of higher than 8.0 μΩ·cm by the precipitation heat treatment. In terms of processability, cracks were confirmed for the samples of Comparative Example 1-3.

The above results show that when the content of Pd as an alloying element of the Pd alloy for electric and electronic devices according to the present invention exceeds 55.5 mass %, the specific resistance and the hardness are significantly reduced after the precipitation heat treatment. It can be seen that when the content of the Pd is less than 50.1 mass %, the values of the specific resistance and the hardness after the precipitation heat treatment become high, and the specific resistance and the hardness cannot be balanced at a high level. It can be seen that when the content of In as an alloying element of the Pd alloy for electric and electronic devices according to the present invention exceeds 2.0 mass %, the hardness and the specific resistance significantly increase after the precipitation heat treatment, and the processability also decreases. It can be seen that when the content of In is less than 0.5 mass %, the decrease in hardness after plastic processing becomes remarkable.

[Comparison Between Example 2 and Comparative Example 2]

Hereinafter, the comparison between Example 2 and Comparative Example 2 will be performed with reference to Table 2.

TABLE 2

| | Composition (mass%) | | | | Vickers hardness (HV0.2) | | Specific resistance (μΩ · cm) | | |
|---|---|---|---|---|---|---|---|---|---|
| Sample | Ag | Pd | Cu | In | After plastic processing | After precipitation heat treatment | After plastic processing | After precipitation heat treatment | Processability |
| Example 2-1 | 10.2 | 53.4 | 35.5 | 1.0 | 303 | 384 | 28.7 | 7.0 | ○ |
| Example 2-2 | 12.5 | 52.0 | 34.8 | 0.8 | 290 | 475 | 27.2 | 7.3 | ○ |
| Example 2-3 | 12.5 | 51.7 | 34.6 | 1.3 | 302 | 444 | 27.6 | 6.9 | ○ |
| Example 2-4 | 12.5 | 51.6 | 34.5 | 1.5 | 300 | 456 | 27.3 | 7.1 | ○ |
| Comparative Example 2-1 | 6.3 | 55.6 | 37.1 | 1.0 | 284 | 280 | 29.7 | 5.8 | ○ |

TABLE 2-continued

| | Composition (mass%) | | | | Vickers hardness (HV0.2) | | Specific resistance (μΩ · cm) | | |
|---|---|---|---|---|---|---|---|---|---|
| Sample | Ag | Pd | Cu | In | After plastic processing | After precipitation heat treatment | After plastic processing | After precipitation heat treatment | Processability |
| Comparative Example 2-2 | 10.3 | 53.9 | 35.8 | — | 277 | 362 | 28.7 | 9.3 | ○ |
| Comparative Example 2-3 | 12.4 | 50.7 | 33.9 | 3.0 | 340 | 555 | 21.6 | 10.1 | × |
| Comparative Example 2-4 | 16.1 | 49.7 | 33.2 | 1.0 | 313 | 506 | 26.5 | 8.0 | ○ |

From the results shown in Table 2, in terms of Vickers hardness, while the samples of Example 2-2 had a Vickers hardness of less than 300 HV after plastic processing, the samples of Examples 2-1 to 2-4 all had values of more than 380 HV after the precipitation heat treatment, and these values satisfied the conditions required for a probe pin (300 HV or more and 480 HV or less). In terms of specific resistance, the samples of Examples 2-1 to 2-4 had a specific resistance of 8.0 μΩ·cm or less by the precipitation heat treatment, which satisfied the conditions required for probe pins (6.0 μΩ·cm or more and 8.0 μΩ·cm or less). In terms of processability, it was not possible to confirm cracks in the samples of Examples 2-1 to 2-4.

From the results shown in Table 2, in terms of Vickers hardness, the samples of Comparative Examples 2-1 and 2-2 had a Vickers hardness of less than 300 HV after plastic processing, and Comparative Example 2-1 also had values of less than 300 HV by the precipitation heat treatment. Furthermore, the samples of Comparative Examples 2-3 and 2-4 had a value of more than 500 HV by the precipitation heat treatment. In terms of specific resistance, the samples of Comparative Example 2-1 had values of less than 6.0 μΩ·cm by the precipitation heat treatment, and the samples of Comparative Examples 2-2 and 2-3 had values of more than 8.0 μΩ·cm by the precipitation heat treatment. In terms of processability, cracks were confirmed for the samples of Comparative Example 2-3.

The above results show that when the content of Pd as an alloying element of the Pd alloy for electric and electronic devices according to the present invention exceeds 55.5 mass %, the specific resistance and the hardness are significantly reduced after the precipitation heat treatment. Also, it can be seen that when the content of the Pd is less than 50.1 mass %, the value of the Vickers hardness after the precipitation heat treatment becomes high, and the specific resistance and the hardness cannot be balanced at a high level. Further, it can be seen that when the content of In as an alloying element of the Pd alloy for electric and electronic devices according to the present invention exceeds 2.0 mass %, the hardness and the specific resistance is significantly increased after the precipitation heat treatment, and the processability is also decreased. It can be seen that when the content of In is less than 0.5 mass %, the decrease in hardness after plastic processing becomes remarkable.

SUMMARY

The results shown in Tables 1 and 2 show that the samples of Examples were generally superior to the samples of Comparative Examples. From these results, it was found that, according to the Pd alloy having the composition of the conditions specified in the present invention, a Pd alloy in which specific resistance, hardness and processability are balanced at a high level can be obtained.

INDUSTRIAL APPLICABILITY

The Pd alloy for electric and electronic devices according to the present invention has high hardness, low specific resistance, excellent processability, and excellent total balance, and is therefore especially useful for use as a probe pin for inspection of semiconductor integrated circuits and the like.

The invention claimed is:
1. A Pd alloy for electric and electronic devices containing Pd as a main component, wherein the Pd alloy for electric and electronic devices has a composition consisting of:
50.1 mass % or more and 55.5 mass % or less of Pd,
6.3 mass % or more and 16.1 mass % or less of Ag,
30.0 mass % or more and 38.0 mass % or less of Cu, and
0.5 mass % or more and 2.0 mass % or less of In,
with the balance being unavoidable impurities.
2. A Pd alloy material for electric and electronic devices, wherein the Pd alloy for electric and electronic devices according to claim 1 is made into a plate or wire shape.
3. A probe pin obtained by using the Pd alloy material for electric and electronic devices according to claim 2.
4. The probe pin according to claim 3, wherein a Vickers hardness is 300 HV or more and 480 HV or less.
5. The probe pin according to claim 4, wherein a specific resistance is 6.0 μΩ·cm or more and 8.0 μΩ·cm or less.
6. The probe pin according to claim 3, wherein a specific resistance is 6.0 μΩ·cm or more and 8.0 μΩ·cm or less.
7. A method for manufacturing a Pd alloy material for electric and electronic devices, the method comprising processing a Pd alloy for electric and electronic devices having a composition consisting of:
50.1 mass % or more and 55.5 mass % or less of Pd,
6.3 mass % or more and 16.1 mass % or less of Ag,

30.0 mass % or more and 38.0 mass % or less of Cu, and
0.5 mass % or more and 2.0 mass % or less of In,
with the balance being unavoidable impurities
into a plate or wire shape during plastic processing so that a cross-sectional reduction rate becomes 50% or more and 95% or less in the final plastic processing.

8. A method for manufacturing a probe pin using a Pd alloy for electric and electronic devices, the method comprising providing a probe pin shape using a Pd alloy material for electric and electronic devices that has been processed into a wire shape so that a cross-sectional reduction rate becomes 50% or more and 95% or less in the final plastic processing during plastic processing a Pd alloy for electric and electronic devices having a composition consisting of:
50.0 mass % or more and 55.5 mass % or less of Pd,
6.3 mass % or more and 16.1 mass % or less of Ag,
30.0 mass % or more and 38.0 mass % or less of Cu, and
0.5 mass % or more and 2.0 mass % or less of In,
with the balance being unavoidable impurities;
heat-treating the probe pin shape at a temperature of 350° C. or more and 550° C. or less to adjust a Vickers hardness to 300 HV or more and 480 HV or less and a specific resistance to 6.0 μΩ·cm or more and 8.0 μΩ·cm or less.

\* \* \* \* \*